(12) United States Patent
Elsayed et al.

(10) Patent No.: US 11,483,510 B2
(45) Date of Patent: Oct. 25, 2022

(54) DIGITAL SERIAL READ-OUT ARCHITECTURE

(71) Applicant: SHENZHEN GOODIX TECHNOLOGY CO., LTD., Shenzhen (CN)

(72) Inventors: Mohamed Elsayed, San Diego, CA (US); Scott D Willingham, San Diego, CA (US)

(73) Assignee: Shenzhen Goodix Technology Co., Ltd., Shenzhen (CN)

(*) Notice: Subject to any disclaimer, the term of this patent is extended or adjusted under 35 U.S.C. 154(b) by 111 days.

(21) Appl. No.: 17/207,712

(22) Filed: Mar. 21, 2021

(65) Prior Publication Data

US 2022/0303483 A1    Sep. 22, 2022

(51) Int. Cl.
| | |
|---|---|
| H03M 1/12 | (2006.01) |
| H04N 5/378 | (2011.01) |
| H03K 21/02 | (2006.01) |
| H03K 5/01 | (2006.01) |
| H03K 3/037 | (2006.01) |
| H03K 5/00 | (2006.01) |
| H04N 5/343 | (2011.01) |

(52) U.S. Cl.
CPC ............. *H04N 5/378* (2013.01); *H03K 3/037* (2013.01); *H03K 5/01* (2013.01); *H03K 21/02* (2013.01); *H03M 1/12* (2013.01); *H03K 2005/00013* (2013.01); *H04N 5/343* (2013.01)

(58) Field of Classification Search
CPC ........ H04N 5/378; H04N 5/343; H03K 3/037; H03K 5/01; H03K 21/02; H03M 1/12
See application file for complete search history.

(56) References Cited

U.S. PATENT DOCUMENTS

2018/0070029 A1\* 3/2018 Centen .................. H04N 5/347

\* cited by examiner

*Primary Examiner* — Joseph J Lauture
(74) *Attorney, Agent, or Firm* — Kilpatrick Townsend & Stockton LLP

(57) ABSTRACT

Techniques are described for implementing read-out architectures to support high-speed serialized read-out of a large number of digital bit values, such as for high-resolution pixel conversions in CMOS image sensor applications. For example, outputs from a large number of digital data sources (e.g., counters) are coupled with transmission gates of the read-out architecture, and the transmission gates are sequentially enabled, thereby shifting in bit data from the data sources one at a time. The transmission gates are grouped into gate groups. For each gate group, embodiments seek balance total path delay across the gate groups by controlling clock and data path delays to be inversely related, and ensuring that total path delays for all gate groups are within a single clock period. Some embodiments include a partitioned bus for further gate group-level control over the path delay and data bus capacitance.

20 Claims, 4 Drawing Sheets

DIGITAL SERIAL READ-OUT ARCHITECTURE

FIELD

The invention relates generally to digital electronics. More particularly, embodiments relate to serial read-out architectures for quickly and efficiently outputting values from a large number of digital circuits, such as for use with outputting pixel conversion count values from large numbers of counter circuits in a complementary metal-oxide semiconductor (CMOS) image sensor.

BACKGROUND

Many electronic devices include cameras and other features that rely on digital image sensors. For example, most modern smartphones include one or more digital cameras that rely on digital image sensing hardware and software to capture and process images. Such applications often perform image sensing using a complementary metal-oxide semiconductor (CMOS) image sensor (CIS). Over time, consumers have desired increased performance from these image sensors, including higher resolution and lower noise. Further, particularly in portable electronic devices (e.g., with fixed battery capacity), it has been desirable to provide such features without adversely impacting power consumption and dynamic range. For example, analog power drives a significant, if not dominant, part of the power consumption of a modern CIS. As such, implementing a high-performance CIS in a portable electronic device can involve designing analog-to-digital converters (ADCs) and other components within strict power efficiency and noise constraints.

The ADCs in the CMOS image sensors convert analog pixel information into digital code ("pixel conversion"). Many applications place strict design requirements on such ADCs. For example, many applications demand operation in context of very high speed clock (e.g., in the Gigahertz range) and strict limits on power and area consumption. For example, conventional architectures can use a ramp-based ADC to compare an analog pixel output voltage (corresponding to signal intensity detected by the pixel) against a reference ramp voltage to generate a pulse having a width proportional to the pixel voltage level. A counter measures the pulse width as a number of elapsed clock cycles, such that the count is a digital representation of the analog pixel output value. A typical modern CMOS image sensor may have hundreds or thousands of pixels in each of hundreds or thousands of rows, and each pixel may have a corresponding counter to output its respective digital count for each pixel conversion cycle. Further, each digital count can be multiple (e.g., 11) bits. Obtaining these digital counts for each pixel conversion cycle can involve reading out millions of bits (or more) of counter data. As such, inefficiencies in the serialization and read-out of the counter data can become a bottleneck in the performance of pixel conversions.

BRIEF SUMMARY OF THE INVENTION

Embodiments provide read-out architectures to support high-speed serialized read-out of a large number of digital bit values, such as for high-resolution pixel conversions in CMOS image sensor applications. For example, outputs from a large number of digital data sources (e.g., counters) are coupled with transmission gates of the read-out architecture, and the transmission gates are sequentially enabled, thereby shifting in bit data from the data sources one at a time. The transmission gates are grouped into gate groups. For each gate group, embodiments seek balance total path delay across the gate groups by controlling clock and data path delays to be inversely related (i.e., so that gate groups with higher clock delay have lower data delay, and vice versa), and ensuring that total path delays for all gate groups are within a single clock period. Some embodiments include a partitioned bus for further gate group-level control over the path delay and data bus capacitance.

According to one set of embodiments, a system is provided for serialized read-out of bit data from a plurality of digital data sources. The system includes: an output flop configured to output a serialized output data signal responsive to a buffered data signal and an input clocking signal; a data path comprising a plurality of gate groups, each having a respective subset of a plurality of transmission gates, each transmission gate to selectively output bit data from a respective one of a plurality of digital data sources in response to assertion of a respective gate enable signal, the data path providing the data signal from the respective gate outputs of the transmission gates to the output flop by adding an amount of data path delay to the data signal to generate the buffered data signal; a clock delay block configured to generate a buffered clocking signal by adding an amount of clock path delay to the input clocking signal; and a gate selector block coupled with the clock delay block to sequentially assert each respective gate enable signal in response to the buffered clocking signal, such that a selected one of the plurality of transmission gates is enabled in each clock cycle of the input clocking signal during a shift-out routine, wherein the amount of clock path delay is different for each of the plurality of gate groups, the amount of data path delay is different for each of the plurality of gate groups.

According to another set of embodiments, an analog-to-digital converter system is provided. The system includes: a plurality of digital counters, each having a respective counter output to output a respective one of a plurality of digital count values corresponding to a detected analog input voltage level; and a serial read-out system. The serial read-out system includes: an output flop configured to output a serialized output data signal responsive to a buffered data signal and an input clocking signal, the serialized output data signal configured to have the plurality of digital count values represented thereon; a data path comprising a plurality of gate groups, each having a respective subset of a plurality of transmission gates, each transmission gate coupled with one of the respective counter outputs to selectively output bit data from a respective one of the plurality of counters in response to assertion of a respective gate enable signal, the data path providing the data signal from the respective gate outputs of the transmission gates to the output flop by adding an amount of data path delay to the data signal to generate the buffered data signal; a clock delay block configured to generate a buffered clocking signal by adding an amount of clock path delay to the input clocking signal; and a gate selector block coupled with the clock delay block to sequentially assert each respective gate enable signal in response to the buffered clocking signal, such that a selected one of the plurality of transmission gates is enabled in each clock cycle of the input clocking signal during a shift-out routine, wherein the amount of clock path delay is different for each of the plurality of gate groups, the amount of data path delay is different for each of the plurality of gate groups.

According to another set of embodiments, another system is provided for serialized read-out of bit data from a plurality of digital data sources. The system includes: means for sequentially shifting in a sequence of bit data based on a buffered clocking signal to generate a data signal, the sequence of bit data pre-grouped into gate groups; means for controlling clock delay to an input clocking signal to generate the buffered clocking signal, an amount of the clock delay controlled to be different for each of the gate groups; means for controlling data delay to the data signal to generate a buffered data signal, an amount of the data delay controlled to be different for each of the gate groups; and means for outputting the buffered data signal responsive to the input clocking signal.

BRIEF DESCRIPTION OF THE DRAWINGS

The accompanying drawings, referred to herein and constituting a part hereof, illustrate embodiments of the disclosure. The drawings together with the description serve to explain the principles of the invention.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION OF THE INVENTION

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

Figure 1:
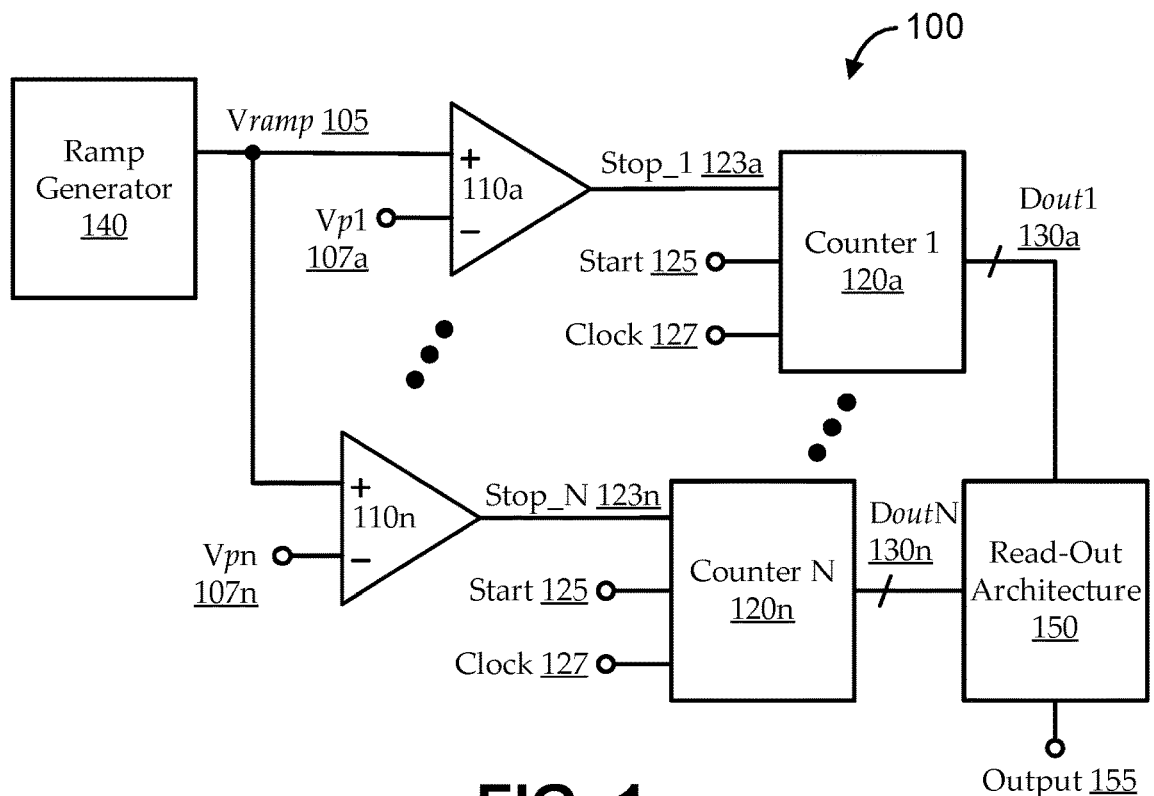
FIG. 1 shows a portion of an illustrative pixel analog-to-digital converter (ADC) system.

FIG. 1 shows a portion of an illustrative pixel analog-to-digital converter (ADC) system 100, as an example context for embodiments described herein. As will be described below, embodiments described herein include efficient serial read-out architectures, which can be used to read out large numbers of bit values from any suitable digital data sources. The pixel ADC system 100 shown in FIG. 1 is one example of a context in which such suitable digital data sources arise. For example, such a pixel ADC system 100 can convert thousands of analog pixel values in a row of pixels into corresponding thousands of multi-bit (e.g., 11-bit) count output values 130; and obtaining the digital pixel output data for the row can involve serially reading out those thousands of bits. Thus, the large numbers of counters 120 in the pixel ADC system 100 can be considered herein as an illustrative type of digital data sources that generates a large number of digital bits to be quickly and efficiently read out by a serial read-out architecture.

As illustrated, the pixel ADC system 100 includes a pixel ramp voltage generator 140 coupled with a number of comparators 110, which are coupled with a number of counters 120. The pixel ramp voltage generator 140 generates a ramp voltage (Vramp) 105, which can essentially be a voltage that begins at a low starting level and charges to a high ending level in a substantially linear fashion. For example, a current generator begins flowing a charging current through a load (e.g., a capacitive load), thereby charging the load. As the load charges, a voltage across the load can increase substantially linearly over time.

As illustrated, the ramp voltage 105 can be received at one of the inputs (e.g., the negative input) of each of the comparators 110. In many typical ADC architectures for image sensors, the same ramp voltage 105 can be shared by multiple comparators 110, such as by all comparators 110 for each row of pixels. The other input (e.g., the positive input) of each of the comparators 110 can be coupled with a respective pixel response voltage (Vp) 107 for a corresponding pixel. For example, the pixel response voltage 107 is an analog output of the pixel corresponding to the intensity of light (e.g., number of photons) detected by a photodetector element of the pixel. Each comparator 110 compares its respective pixel response voltage 107 to the ramp voltage 105. The ramp voltage 105 can be configured so that the ramp begins at a level assumed to be below any pixel response voltage 107, and so that the ramp ends at a level assumed to be above any pixel response voltage 107. At some point in a pixel conversion cycle, the linearly changing level of the ramp voltage 105 will cross the level of the pixel response voltage 107, thereby triggering a change in state of the output of the corresponding comparator 110.

In such a configuration, the output of each comparator 110 is effectively be a pulse that begins at a first point in time corresponding to the ramp voltage beginning to increase, and that ends at a second point in time corresponding to the ramp voltage 105 level crossing the pixel response voltage 107 level. As such, different levels of pixel response voltage 107 will result in different timing for the state change at the output of the comparator 110, and the width of the pulse between the first and second points in time correlates to a measure of the pixel response voltage 107 level. As illustrated, the comparators 110 are coupled with counters 120 that are configured to generate a digital output 130 indicating a measure of the pulse width, and thereby a measure of the pixel response voltage 107 level.

As such, each counter 120 can be coupled with the output of a respective one of the comparators 110 to receive the output signal as a stop signal 123. Each counter 120 also receives a start signal 125 and an input clock signal 127. The start signal 125 indicates the start of the ramp (i.e., when the ramp voltage begins to increase from its starting level). A change in state (e.g., assertion or deassertion) of the start signal 125 triggers the counter 120 to begin counting pulses of the input clock signal 125. The count continues until the counter 120 detects a change in state of the stop signal 123, corresponding to the change in state of the comparator 110 output. At this point, each counter 120 can stop counting and can generate a respective digital count value 130. For example, each digital count value 130 can include N bits (e.g., 11 bits), and there may be a large number of such digital count values 130 at the outputs of a large number of counters 120. The counter 120 outputs can be coupled with a read-out architecture 150, which can efficiently serialize and read out the digital count values to generate a digital output signal 155.

Figure 2:
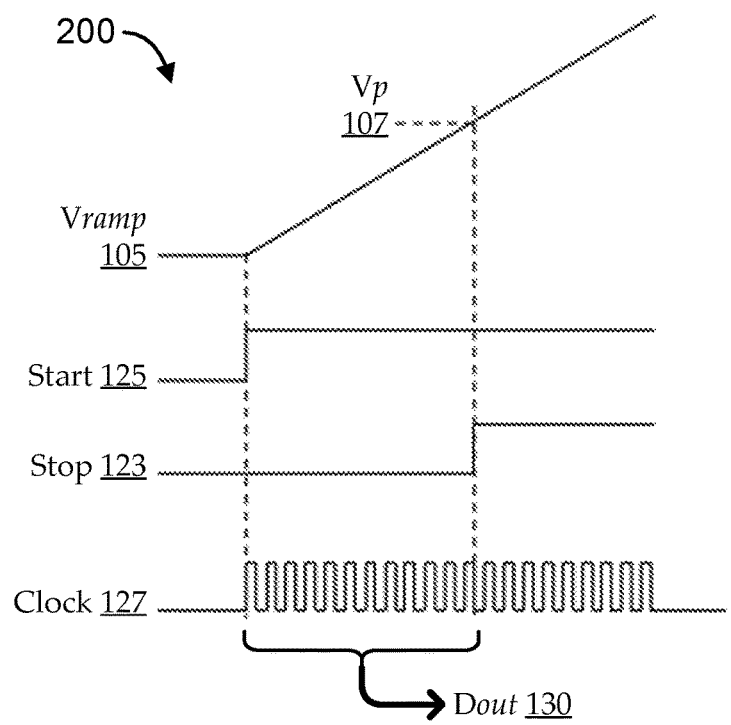
FIG. 2 shows simplified plots of illustrative signals of FIG. 1.

For added clarity, FIG. 2 shows simplified plots of illustrative signals of FIG. 1. As illustrated, a change in state of a start signal 125 (e.g., a rising edge) triggers the ramp voltage 105 to begin rising from some low starting level. The ramp voltage 105 can continue to rise (e.g., substantially linearly) over some period of time. At some point, as the ramp voltage 105 increases, it crosses the level of an illustrative pixel response voltage 107. For example, the pixel response voltage 107 corresponds to a detected intensity of a photodetector at a pixel corresponding to the pixel response voltage 107. As illustrated in FIG. 1, when the rising level of the ramp voltage 105 crosses the pixel response voltage 107 level, the state of the output of a corresponding comparator 110 changes, and that output can be used as the stop signal 123. It can be seen in FIG. 2 that the stop signal 123 changes state responsive to the level of the ramp voltage 105 crossing the pixel response voltage 107 level.

An input clock signal 127 is also shown. The input clock signal 127 may be any suitable periodic signal, but is typically a square wave with approximately 50-percent duty cycle.

As described with reference to FIG. 1, a counter 120 can be triggered to start counting cycles of the input clock signal 127 (e.g., rising edges, or other detectable state changes) responsive to the start signal 125 and to stop counting cycles of the input clock signal 127 responsive to the stop signal 123. The number of elapsed cycles of the input clock signal 127 between the start signal 125 and the stop signal 123 can be used as a measure of the pixel response voltage 107 and can be output by the counter 120 as the digital count value 130.

Figure 3:
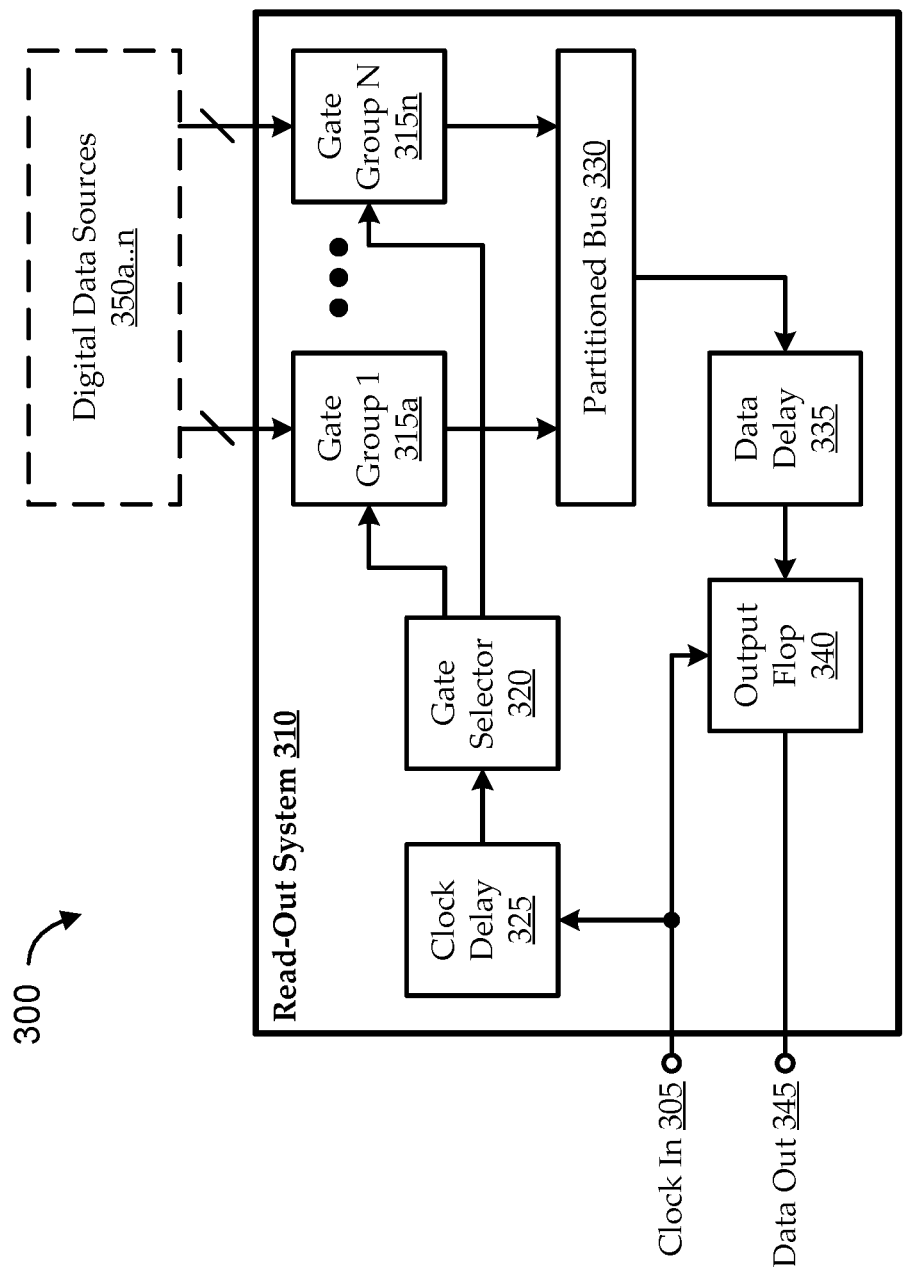
FIG. 3 shows a novel serial read-out architecture, according to embodiments described herein.

FIG. 3 shows a novel serial read-out architecture 300, according to embodiments described herein. Digital data sources 350 are shown for added context. As noted above, the digital data source 350 can include any components, systems, devices, etc. that output large numbers of digital bits for read-out. For example, the large numbers of counters 120 of the pixel ADC system 100 of FIG. 1 is an example of such a suitable digital data source. Another example of digital data sources 350 can be a memory, a bank of registers, etc. As described herein, the serial read-out architecture 300 can quickly and efficiently read out digital output data from the digital data sources 350 to generate a serialized output data signal 345.

As illustrated, embodiments of the serial read-out architecture 300 include multiple gate groups 315 in communication with a partitioned bus 330. Though not explicitly shown, each gate group 315 includes multiple gates corresponding to an output of one of the digital data sources 350. An input clocking signal 305 is passed through a clock delay block 325 to control timing of a gate selector block 320, which iteratively selects each of the gates in each of the gate groups 315 for output of a corresponding selected data bit to the partitioned bus 330. The corresponding selected data bit that is output to the partitioned bus 330 is passed through a data delay block 335 to an output flop 340. The output flop 340 can then output the corresponding selected data bit on the serialized output data signal 345 in response to the input clocking signal 305.

In some application contexts, there can be a large path length difference between the source of the input clocking signal 305 and different ones of the digital data sources 350 (e.g., clock path length). For example, each ADC of a CMOS image sensor can be relatively large, and there may be no practical way to lay out large numbers of such ADCs without creating large path length differences between those ADCs and the source of the input clocking signal 305.

Similarly, there can be large path length differences between different ones of the digital data sources 350 and the output flop 340 (e.g., data path length). Embodiments of the serial read-out architecture 300 seek to substantially balance overall effective path length to and from the gate groups 315 across the clock delay block 325, the partitioned bus 330, and the data delay block 335. Such balancing can include implementing a clock path and a data path, so that the effective path length (e.g., in amount of delay and/or physical distance) in one path increases as the effective path length in the other path decreases. For example, embodiments are configured, so that digital data sources 350 having a larger associated clock path length will be in communication with the output flop 340 via a smaller associated data path length; and digital data sources 350 having a smaller associated clock path length will be in communication with the output flop 340 via a larger associated data path length.

An overall path delay can be considered as an amount of time from when there is clock pulse at the input clocking signal 305 node (e.g., any change in clock state to which components of the serial read-out architecture 300 are designed to respond, such as a clock rising or falling edge) to when a resulting read-out bit of data is received by the output flop 340. For example, a clock pulse is delayed by a first amount at the clock delay block 325 prior to triggering the gate selector block 320 to selectively read in data from a next gate of one of the gate groups 315. The read-in data is passed to the partitioned bus 330, where it is delayed by a second amount prior to being communicated to the data delay block 335. In some cases, that second amount can also include the input gate path (e.g., from each transmission gate to the data bus). The read-in data is then delayed by a third amount at the data delay block 335 prior to being communicated to the output flop 340. The first, second, and third amounts of delay add together to provide approximately a predetermined amount of overall delay. For example, the desired overall delay may be T picoseconds, the data delay block 335 may provide a fixed delay of approximately T/2 picoseconds, and the clock delay block 325 and the partitioned bus 330 together provide an additional approximately T/2 picoseconds of delay. In such an example, the clock delay block 325 and the partitioned bus 330 can be designed so that digital data sources 350 that are more distance from the input clocking signal 305 and experience more delay in the clock delay block 325, accordingly, will experience less delay in the partitioned bus 330; and digital data sources 350 that are closer to the input clocking signal 305 and experience less delay in the clock delay block 325, accordingly, will experience more delay in the partitioned bus 330; such that the combined delay across the clock delay block 325 and the partitioned bus 330 remains substantially consistent.

Grouping of digital data source 350 outputs into gate groups 315 can provide various features. One feature is that the gate groups 315 facilitate providing more balance between the clock and data path delays across the large number of digital data sources 350, which can improve power efficiency of the serial read-out architecture 300. Another feature is that balancing total path delays across the gate groups can facilitate higher-speed operation. Embodiments are designed to ensure that total path delays for all gate groups 315 (including the worst-case total path delay) are within a single clock period. It can be seen that, by balancing the path delays as described herein, the worst-case path lengths are much shorter than they would be (e.g., around half) without such balancing. Another feature is that the gate groups 315 facilitate use of the partitioned bus 330 to reduce the bus load seen by the gates of the gate groups 315. For example, a large data bus can be seen as a large load (e.g., and can add appreciable parasitic effects). Partitioning the bus according to the gate groups 315 can effectively reduce the size of the bus seen by each gate, which can increase signal speed, reduce power, and/or reduce gate component areas (e.g., the area of a buffer at the input of each gate of each gate group 315).

Figure 4:
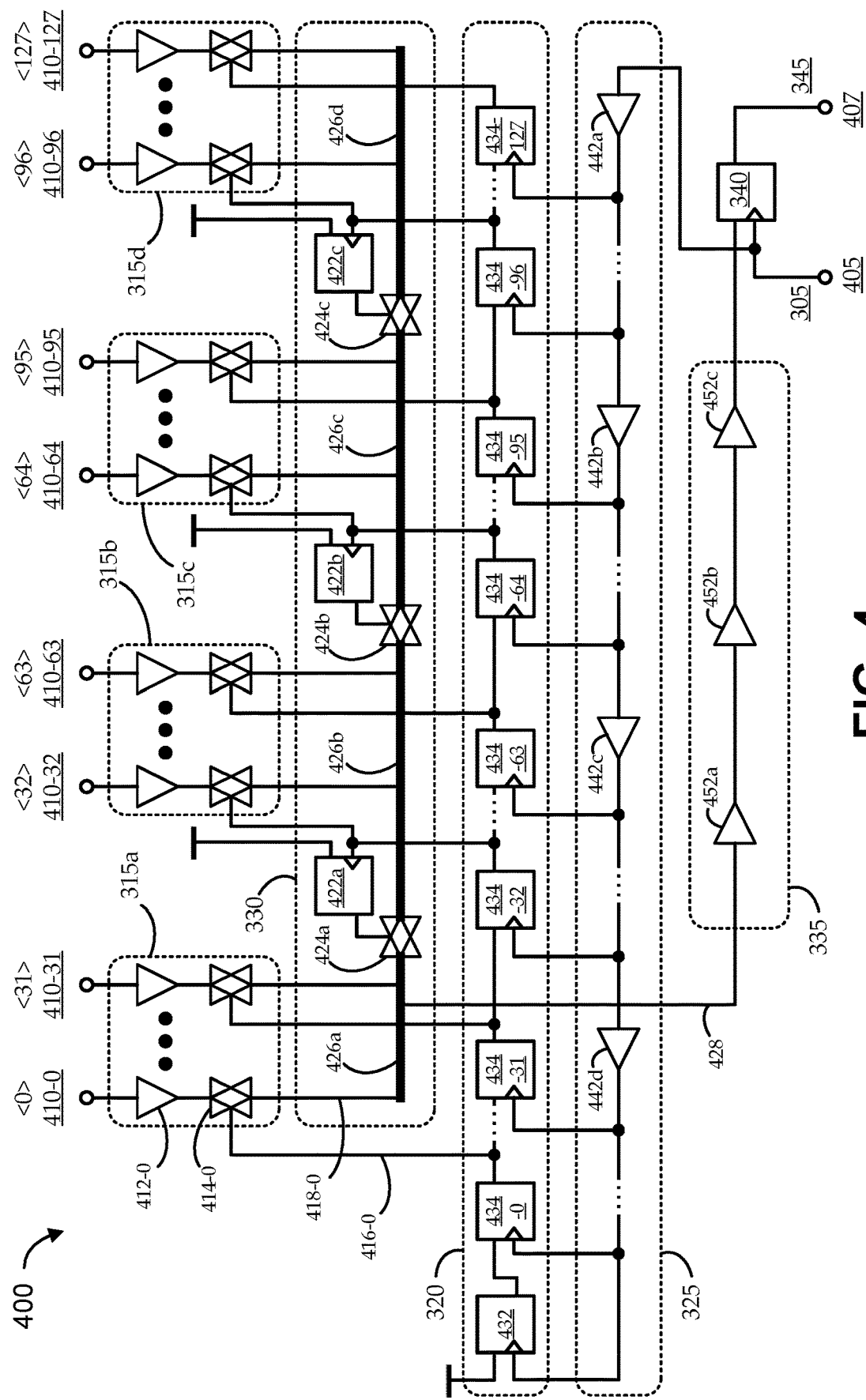
FIG. 4 shows an illustrative implementation of a serial read-out architecture, according to embodiments described herein.

FIG. 4 shows an illustrative implementation of a serial read-out architecture 400, according to embodiments described herein. The serial read-out architecture 400 can be an implementation of the serial read-out architecture 300 of FIG. 3. As illustrated, the serial read-out architecture 400 can generate a serialized output data signal 345 responsive to an input clocking signal 305. Components of the serial read-out architecture 400 can include multiple gate groups 315, a gate selector block 320, a clock delay block 325, a partitioned bus 330, a data delay block 335, and an output flop 340. Each gate group 315 is configured to couple with outputs of a number of digital data sources 350 (not shown) to receive one bit at a time.

The illustrated implementation assumes that the serial read-out architecture 400 is coupled with 128 digital data sources 350, such as with 128 digital counters. The output of each of the digital data sources 350 is coupled with a respective data source node 410. For example, the data source nodes 410-0 through 410-127 are each coupled with the output of a respective one of digital data sources 350-0 through 350-127. In one implementation, each of the data source nodes 410 represents a single bit (e.g., generates a single bit at a time at its output). In other implementations, each digital data source 350 can be configured to output a multi-bit digital value to its respective data source node 410. In other implementations, each data source node 410 is coupled with a bus running to one or more digital data sources 350, and similar or different techniques are used to shift out the data to the data source nodes 410.

Each data source node 410 is coupled with a transmission gate (T-gate) 414. In some implementations, each data source node 410 is coupled to the T-gate 414 directly. For example, using digital counters as the digital data sources 350, flip-flops performing the counting in the counters can directly drive the T-gates 414. In other implementations, each data source node 410 is coupled with the T-gate 414 via a respective read-in buffer 412. For example, the T-gate 414 can be implemented as an NMOS transistor and a PMOS transistor with the source nodes tied together, the drain nodes tied together, and their respective gate nodes driven by complementary enable signals 416. The operation of each T-gate 414 can effectively be a tri-state buffer. For example, when the gate enable signal 416 is de-asserted, the de-asserted gate enable signal 416 can turn off the NMOS transistor, and the complement of the de-asserted gate enable signal 416 can turn off the PMOS transistor; such that the T-gate 414 is effectively an open circuit with high impedance from the perspective of its gate output signal 418. In contrast, when the gate enable signal 416 is asserted, the asserted gate enable signal 416 can turn on the NMOS transistor, and the complement of the asserted gate enable signal 416 can turn on the PMOS transistor; such that the T-gate 414 is effectively a short circuit path to the read-in buffer 412 (e.g., the PMOS tending more strongly to pass a '1' from the read-in buffer 412, and the NMOS tending more strongly to pass a '0' from the read-in buffer 412) from the perspective of its gate output signal 418. As will be explained more fully below, embodiments only enable one T-gate 414 at a time, thereby effectively providing one bit at a time to the partitioned bus 330.

The data source nodes 410, and their associated read-in buffers 412 and T-gates 414 are grouped into gate groups 315. The illustrated implementation uses four gate groups 315 for supporting the 128 digital data sources 350. Embodiments can use any suitable number of gate groups 315 to support any suitable number and/or type of digital data sources 350. As described herein, the gate groups 315 facilitates balancing of clock and data path delay and path distance, and the number of gate groups 315 can be chosen to maintain path specifications to within predetermined thresholds. For example, increases in the physical size of digital data sources 350 can similarly increase the path distances between some of those digital data sources 350 and other components (e.g., the source of the input clocking signal 305, the output flop 340, etc.); and the number of gate groups 315 (and corresponding number of partitions of the partitioned bus 330) may increase to accommodate those increases in path distance.

The gate output signals 418 from all of the T-gates 414 are coupled with the partitioned bus 330. As described above, the partitioned bus 330 can include a same number of bus partitions 426 as the number of gate groups 315 (e.g., four in the illustrated implementation). As such, the gate output signals 418 from all of the T-gates 414 in each particular gate group 315 are coupled with a respective one of the bus partitions 426 of the partitioned bus 330. For example, a first gate group 315a is associated with data source nodes 410-0 through 410-31 (i.e., the first 32 digital data sources 350), each coupled, respectively, with associated read-in buffers 412-0 through 412-31 and associated T-gates 414-0 through 414-31. The outputs of those T-gates 414-0 through 414-31 are gate output signals 418-0 through 418-31, all of which are coupled with a first bus partition 426a.

Each bus partition 426 is separated from its adjacent bus partition 426 by a one-way bus buffer 424. Each one-way bus buffer 424 can be implemented by a T-gate (as illustrated), or other tri-state buffer, or any other suitable component. In effect, each one-way bus buffer 424 selectively couples or isolates bus partitions 426 from each other. For example, when reading data from the first gate group 315a, all of the one-way bus buffers 424 are turned off (i.e., set as an open circuit), and the one-way bus buffer 424a provides very high impedance at the right-hand edge of the first bus partition 426a. In effect, from the perspective of components of the first gate group 315a, the entire data bus appears to be only as long as the first bus partition 426a. As described below, the data from the partitioned bus 330 is communicated as a bus output signal 428 to the data delay block 335. From the perspective of the data delay block 335, the coupling with the partitioned bus 330 and the enabled T-gate 414 has very low impedance. When reading data from the fourth gate group 315d, all of the one-way bus buffers 424 are turned on (i.e., set as closed circuits), and the data is still read off of the bus (as the bus output signal 428) from the region of the first bus partition 426a. When turned on, each one-way bus buffer 424 provides very high input impedance and very low output impedance. As such, from the perspective of components of the fourth gate group 315d, the entire data bus still appears to be only as long as a single (i.e., the fourth) bus partition 426d; while, from the perspective of the data delay block 335, the coupling with the partitioned bus 330 and the enabled T-gate 414 (through three one-way bus buffers 424) still has very low impedance.

The serialization provided by the serial read-out architecture 400 is essentially a "shift-out" process that shifts out the outputs of the digital data sources 350, one by one, in serial fashion. As noted above, each counter output can be any suitable integer number N of bits, but the description assumes each counter output is only a single bit for the sake of simplicity. The shift-out is controlled by the gate selector block 320. As illustrated, the gate selector block 320 can be implemented as an initiator flop 432 coupled with a series of gate activation flops 434. Each gate activation flop 434 is associated with a corresponding one of the T-gates 414. The gate activation flops 434 are arranges in a shift-register configuration. In such a configuration, the output of any gate activation flop 434$n$ drives the input of the next gate activation flop 434($n$+1), and all of the gate activation flops 434 are clocked according to the same input clocking signal 305 (e.g., or by a buffered version of the input clocking signal 305). The output of each gate activation flop 434 is used as a respective gate enable signal 416 for enabling the corresponding one of the T-gates 414, and the gate selector block 320 essentially shifts the gate enable signal 416 over to each next gate activation flop 434 in sequence, while keeping all the other T-gates 414 disabled.

Prior to shifting out the data, the gate selector block 320 can reset the initiator flop 432 and the gate activation flops 434, such that the "Q" output of all the flops in the gate selector block 320 is '0'. As illustrated, the "Q_bar" output of the initiator flop 432 is coupled with the data input of the first gate activation flop 434-0, such that the data input to the first gate activation flop 434-0 is '1'; and the Q output of each gate activation flop 434 is coupled with the data input of the next gate activation flop 434 in sequence, such that the data input to each subsequent gate activation flop 434-1 through 434-127 is '0'. At the first clock rising edge (e.g., or any other suitable clock transition), the '1' at the output of the initiator flop 432 is shifted to the Q output of the first gate activation flop 434-0. The Q outputs of all the other gate activation flops 434 remain at '0'. With the first gate output signal 418-0 asserted, and all other gate output signals 418 remaining de-asserted, the first T-gate 414-0 is enabled, and all other T-gates 414 remain disabled. As such, the data bit received at the first data source node 410-0 and buffered by the first read-in buffer 412-0 is passed to the partitioned bus 330 (to the first bus partition 426$a$). As illustrated, the data input of the initiator flop 432 is coupled with a HIGH reference, such that when not being reset, the Q_bar output of the initiator flop 432 is '0'. As such, after the first clock rising edge, the data input to the first gate activation flop 434-0 becomes '0', the data input to the second gate activation flop 434-1 becomes '1' (i.e., coupled with the output from the first gate activation flop 434-0, which transitioned to '1' in response to the first clock rising edge), and the data input to the second gate activation flop 434-1 remains at '0'. Thus, upon the second clock rising edge, the first gate enable signal 416-0 becomes de-asserted, the second gate enable signal 416-1 becomes asserted, and all other gate enable signals 416 remain de-asserted. It can be seen that, in each subsequent clock cycle, the next gate enable signal 416 in sequence is asserted, and all other gate enable signals 416 are de-asserted. Thus, in each clock cycle, each next T-gate 414 is sequentially enabled, one at a time.

Embodiments of the gate selector block 320 can also control activation of bus partitions 426 of the partitioned bus 330. As illustrated, each gate enable signal 416 that corresponds to a first T-gate 414 in a gate group 315 can also be used to enable a one-way bus buffer 424 associated with that gate group 315. For example, the second gate group 315$b$ includes T-gates 414-32 through 414-63, and the third gate group 315$c$ includes T-gates 414-64 through 414-95. When the output of gate activation flop 434-32 goes HIGH to assert gate enable signal 416-32, this enables T-gate 414-32 and also triggers a first bus buffer enable flop 422$a$ to enable the first one-way bus buffer 424$a$. For example, each bus buffer enable flop 422 is edge-triggered so as to enable its corresponding one-way bus buffer 424 responsive to detecting assertion of the gate enable signal 416. Similarly, when the output of gate activation flop 434-64 goes HIGH to assert gate enable signal 416-64, this enables T-gate 414-64 and also triggers a second bus buffer enable flop 422$b$ to enable the second one-way bus buffer 424$b$.

Notably, when enabled, each one-way bus buffer 424 can add delay to the data signal as it passes from the T-gate 414 to the data delay block 335 through the bus partitions 426. For example, in the illustrated implementation, data from the first gate group 315$a$ can pass through the partitioned bus 330 to the data delay block 335 without substantial additional delay. Data from the second gate group 315$b$ passes through the partitioned bus 330 to the data delay block 335 with added delay from a single one-way bus buffer 424$a$. Data from the third gate group 315$c$ passes through the partitioned bus 330 to the data delay block 335 with added delay from two one-way bus buffers 424$a$ and 424$b$. Data from the fourth gate group 315$d$ passes through the partitioned bus 330 to the data delay block 335 with an added delay from three one-way bus buffers 424$a$, 424$b$, and 424$c$.

Embodiments can generally include any suitable integer number (N) of gate groups 315 (N=4 in the illustrated implementation), such that the partitioned bus 330 has N bus partitions 426. Each nth bus partition 426 (i.e., each of the first through Nth bus partitions 426) is coupled with the respective gate outputs 418 of the T-gates 414 of the nth one of the N gate groups 315. The bus partitions 426 are coupled with each other via at least N−1 one-way bus buffers 424 (e.g., the four bus partitions 426 in the illustrated implementation are coupled with each other via three one-way bus buffers 424). In some embodiments, if there is an integer number (K) of T-gates 414, each of the N gate groups 315 can be said to correspond to a respective sequence of K/N of the T-gates 414, such that the respective sequence of each nth gate group 315 begins at an associated group-start gate that is the [(n−1) * (K/N)+1]th T-gate 414 of the K T-gates 414. For example, in the illustrated implementation, K is 128 and N is 4, and the group start gate of the third (i.e., n=3) gate group 315$c$ is the 65th T-gate (labeled in the FIGS. as 414-64, as the first T-gate is labeled as 414-0), corresponding to (3−1)*(128/4)+1=65. It can be seen that the gate enable signal 416 that enables the group-start gate for each gate group 315 is also the gate enable signal 416 that enables the one-way bus buffer 424 for activation of the bus partition 426 associated with that gate group 315 (e.g., assertion of gate enable signal 416-64 enables T-gate 414-64 and one-way bus buffer 424$b$).

Embodiments of the clock delay block 325 and the data delay block 335 can be implemented as a series of clock delay buffers 442 and data delay buffers 452, respectively. While the components are described as "delay buffers" the buffers themselves may only contribute slightly to the overall delay in their respective paths. In cases of long transmission distances (e.g., the distance between a clock signal source and a farthest digital data source 350 may be on the order of a millimeter), the long transmission line can produce appreciable capacitance, which can cause signal delay. The various buffers in the clock and data paths can effectively break up the long transmission lines, such that each section is effectively shorter and has appreciably less capacitance and associated delay. As such, in some cases, the number of buffers along a transmission line may be indicative of an amount of delay insofar as the number of buffers can tend to correspond to the length of the transmission line. Thus, reference herein to "delay buffer," or "a buffer's worth of delay," or the like, is intended generally to refer to any delay in a portion of a transmission line being driven by a buffer (e.g., including delay caused by the buffer itself and parasitic effects of the section of transmission line being driven by the buffer).

In some implementations, each of the clock delay buffers 442 and data delay buffers 452 can be implemented in substantially the same way to be associated with substantially the same amount of delay. In some implementations, the amount of delay added by each of the clock delay buffers 442 and data delay buffers 452 (and their associate transmission line sections) can be similar to the amount of delay added by each of the one-way bus buffers 424 of the partitioned bus 330 (and their corresponding bus partitions 426). For example, the illustrated implementation includes four clock delay buffers 442, three data delay buffers 452, and three one-way bus buffers 424; and each of those buffers can be considered as associated with one buffer's worth of delay (e.g., "1B"). In operation, overall path delay can be balanced across the gate groups 315, so that data from each gate group 315 experiences a total of 7B of delay (e.g., where 7B of delay is well within a single clock period). For example, for data of the first gate group 315a, the clock delay block 325 introduces 4B of delay, the partitioned bus 330 introduces no additional delay, and the data delay block 335 introduces 3B of delay; or 7B of total delay. For data of the fourth gate group 315d, the clock delay block 325 introduces 1B of delay, the partitioned bus 330 introduces 3B of delay, and the data delay block 335 introduces 3B of delay; again for a total of 7B of total delay.

For the sake of illustration, suppose it is time in a sequential shift-out process to read the bit output received at data source node 410-5 (i.e., in the first gate group 315a). A rising clock edge on the input clocking signal 305 is received at an input node 405. The input clocking signal 305 passes through all of clock delay buffers 442a through 442d before reaching the input to gate activation flop 434-5. As such, there is a first amount of delay (e.g., 4B) corresponding to clock path delay between the time the rising clock edge is received at the input node 405 and the time the rising clock edge triggers gate activation flop 434-5, thereby asserting gate enable signal 416-5. This enables T-gate 414-5, causing the bit data at data source node 410-5 to be communicated (on gate output signal 418-5) to the first bus partition 426a and to the data delay block 335 without appreciable delay. In the data delay block 335, the data signal passes through three data delay buffers 452a, 452b, and 452c before reaching the output flop 340. As such, there is a second amount of delay (e.g., 3B) corresponding to data path delay between the time the T-gate 414-5 is enabled and the time the data reaches the input to the output flop 340. Upon receipt of the next rising clock edge, the output flop 340 will shift its input to its output, such that the data from data source node 410-5 will be output on the serialized output data signal 345 at an output node 407 of the serial read-out architecture 400.

For the sake of further illustration, suppose it is time in a sequential shift-out process to read the bit output received at data source node 410-105 (i.e., in the fourth gate group 315d). A rising clock edge on the input clocking signal 305 is received at the input node 405. The input clocking signal 305 now only passes through one of the clock delay buffers 442a before reaching the input to gate activation flop 434-105. As such, there is a first amount of delay (e.g., 1B) corresponding to smaller clock path delay between the time the rising clock edge is received at the input node 405 and the time the rising clock edge triggers gate activation flop 434-105, thereby asserting gate enable signal 416-105. This enables T-gate 414-105, causing the bit data at data source node 410-105 to be communicated (on gate output signal 418-105) to the fourth bus partition 426d. At this point in the shift-out sequence, all of one-way bus buffers 424a, 424b, and 424c have been enabled. As such, the data communicated from the T-gate 414-105 now passes through the three one-way bus buffers 424 prior to reaching the data delay block 335, which can add a second amount of delay (e.g., 3B) corresponding to first data path delay. In the data delay block 335, as in the previous illustration, the data signal passes through three data delay buffers 452a, 452b, and 452c before reaching the output flop 340. As such, there is a third amount of delay (e.g., 3B) corresponding to second data path delay. Now, the total data path delay between the time the T-gate 414-105 is enabled and the time the data reaches the input to the output flop 340 includes both the delay from the one-way bus buffers 424 and from the data delay buffers 452. Upon receipt of the next rising clock edge, the output flop 340 will shift its input to its output, such that the data from data source node 410-5 will be output on the serialized output data signal 345 at an output node 407 of the serial read-out architecture 400.

Embodiments are designed to ensure that the total delay from when a clock rising edge is received at the input node 405 until the data read from one of the T-gates 414 reaches the input of the output flop 340 must be less than one clock period. For example, an implementation designed to operate with a 2.5 Megahertz clock can be configured so that the total delay through both the clock path and the data path is well below 400 nanoseconds. Further, generally, embodiments of the serial read-out architecture 400 seek to ensure that digital data sources 350 having larger associated clock path delays will have smaller associated data path delays, and vice versa. As such, though the illustrated implementation includes four clock delay buffers 442, three data delay buffers 452, and three one-way bus buffers 424, any suitable number of buffers and/or other delay elements can be used. Further, the controlled variability of the path delays can be implemented in any suitable manner. For example, the illustrated implementation essentially includes a variable clock path delay, a variable portion of a data path delay, and a fixed portion of a data path delay. Some alternative implementations include both variable and fixed portions of a clock path delay (e.g., by adding a fixed number of clock delay buffers 442 prior to clock delay buffer 442a). Further, the particular arrangement of variability can be implemented in any suitable manner. For example, in the illustrated implementation, the data from the first gate group 315a experiences the largest clock path delay and the smallest data path delay, and the data from the fourth gate group 315d experiences the smallest clock path delay and the largest data path delay. Some alternative implementations are arranged so that the data from the fourth gate group 315d experiences the largest clock path delay and the smallest data path delay, and the data from the first gate group 315a experiences the smallest clock path delay and the largest data path delay.

The above description, and the illustrated implementation of FIG. 4, are simplified to assume that each digital data source 350 outputs a single bit. In many applications, however, each digital data source 350 outputs multiple bits in parallel. For example, an 11-bit digital counter can output 11 bits in parallel as an output count value. In some such embodiments, each of the parallel bit outputs can be considered as its own digital data source 350. For example, if each digital data source 350 is an 11-bit counter that outputs 11 bits in parallel, each bit output can be considered as its own "digital data source" in the sense that each of the 11 bit outputs can be coupled, via a respective one of 11 data source nodes 410 and T-gate 414 (e.g., via a respective input buffer 412). Such an implementation can effectively shift out each bit of each digital data source 350 in turn, such that a single serialized data output signal 345 represents a serialization of all the data bits from all the digital data sources 350.

In other such embodiments, certain components of the read-out architecture 400 represent a repeated parallel structure configured to accommodate the parallel bit structure of the multi-bit digital data sources 350. For example, M serialized data output signals 345 are generated, each representing a serialization of a respective one of M bit positions being output by all the digital data sources 350. In some such implementations, a single clock path is used to control the clock delay and control gate selection for multiple, parallel data paths. In particular, implementations can include one clock delay block 325 and one gate selector block 320, coupled with M parallel copies of each gate group 315, of the partitioned bus 330, of the data delay block 335, and of the output flop 340. For example, the illustrated first data source node 410-0, and its corresponding first input buffer 412-0 and first T-gate 414-0, can represent a parallel set of M first data source nodes 410-0, M first input buffers 412-0 and M first T-gates 414-0. All of the M first T-gates 414-0 can be enabled using the same gate enable signal 416, such that all of the input gating paths associated with the parallel outputs of a same digital data source 350 are enabled as a unit (i.e., concurrently). Each of these M input gating paths can be coupled with a respective one of M data output paths, such that each of M data signals is communicated (in parallel with the other M−1 data signals) via a respective one of M partitioned buses 330 and data delay blocks 335, to a respective one of M output flops 340 (i.e., the illustrated partitioned bus 330, data delay block 335, and output flop 340 represent a parallel set of M partitioned buses 330, M data delay blocks 335, and M output flops 340, respectively).

Figure 5:
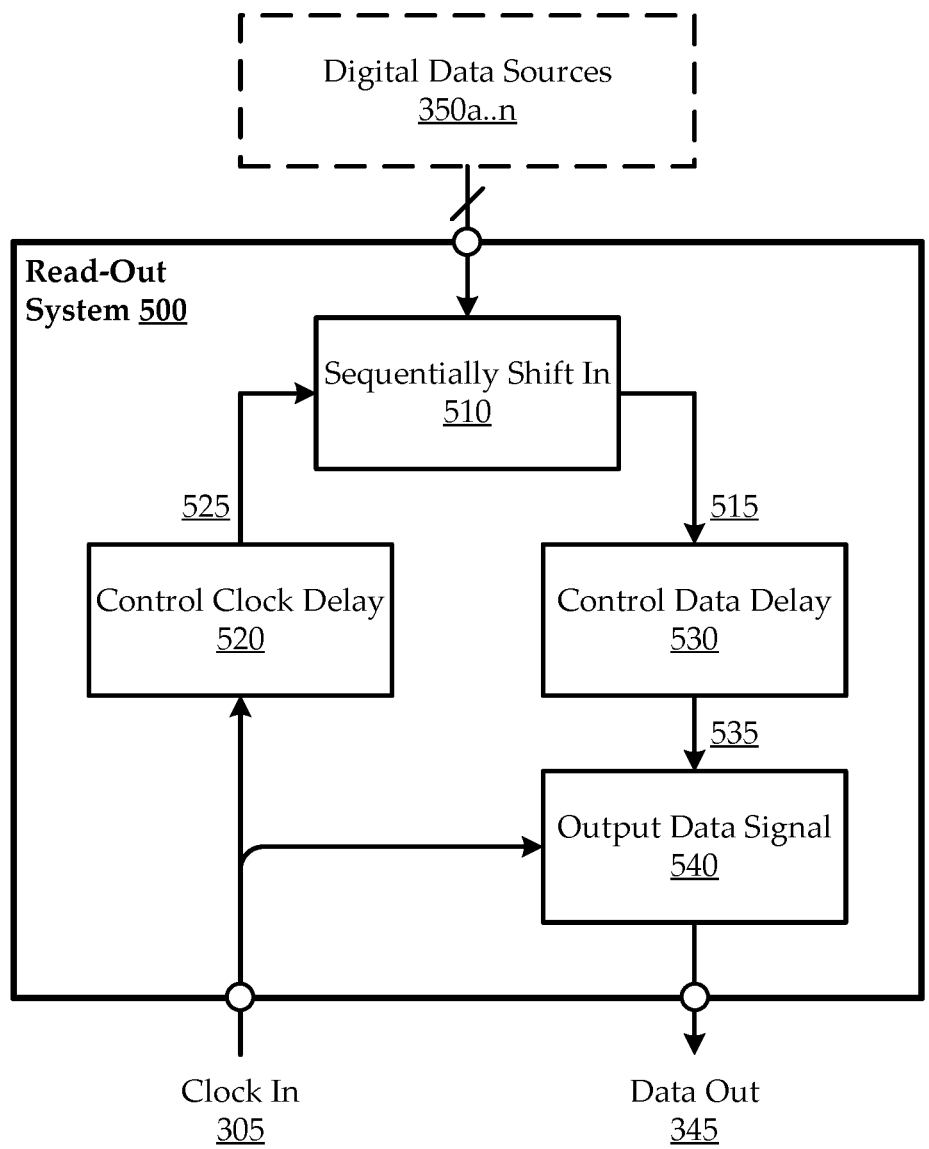
FIG. 5 shows a functional block diagram of a illustrative system for serialized read-out of bit data from a number of digital data sources, according to various embodiments.

FIG. 5 shows a functional block diagram of a illustrative system 500 for serialized read-out of bit data from a number of digital data sources 350, according to various embodiments. The functional blocks of the system 500 can be implemented using any suitable structures, such as those described with reference to FIGS. 3 and 4. The system 500 can have various input/output nodes. For example, an input clocking signal 305 can be received via a first input node, bit data from the digital data sources 350 can be received via a second input node (e.g., or a number of nodes corresponding to the number of digital data sources 350), and a serialized data output signal 345 can be output from the system 500 via an output node.

As illustrated, the system 500 includes a first functional component 510 providing means for sequentially shifting in a sequence of bit data based on a buffered clocking signal 525 to generate a data signal. As described herein, the sequence of bit data is pre-grouped into gate groups corresponding to groups of the digital data sources 350. The shifted in bit data can be output by the first functional component 510 as a data signal 515. In some embodiments, the first functional component includes means for sequentially enabling each of multiple transmission gates, where each transmission gate is coupled with one of the digital data sources 350 to receive a corresponding portion of the bit data.

A second functional component 520 can provide means for controlling clock delay to the input clocking signal 305 to generate the buffered clocking signal 525. The amount of the clock delay is controlled to be different for each of the different gate groups. A third functional component 530 can provide means for controlling data delay to the data signal 515 to generate a buffered data signal 535. The amount of the data delay is controlled to be different for each of the gate groups. In some embodiments, each gate group corresponds to a respective portion of the bit data, the third functional component 530 includes a partitioned data bus having multiple bus partitions, and the first functional component 510 includes means for sequentially shifting in each respective portion of the bit data to a respective bus partition of the partitioned data bus. In such embodiments, the third functional component 530 can add a different amount of the data delay for each gate group based on the respective bus partition used for sequentially shifting in the respective portion of the bit data corresponding to the gate group.

Embodiments can include a fourth functional component 540 that can provide means for outputting the buffered data signal 535 responsive to the input clocking signal 305. For example, in kth clock cycle of a shift-out routine, a kth bit of the bit data is shifted in by the first functional component 510, and the (k−1)th bit of the bit data is output onto the serialized data output signal 345 by the fourth functional component 540. In some embodiments, a total amount of path delay for any of the gate groups corresponds to the amount of the clock delay added by the second functional component 520 and the amount of the data delay added by the third functional component 530. The total amount of path delay can be balanced across all of the gate groups, such that the added amount of the data delay is controlled to be smaller for those of the gate groups for which the added amount of the clock delay is controlled to be larger, and the added amount of the data delay is controlled to be larger for those of the gate groups for which the added amount of the clock delay is controlled to be smaller. In some embodiments, the total amount of path delay is substantially the same for all gate groups, even though the respective contributions of the clock delay and the data delay are different. Embodiments of the second functional component 520 and the third functional component 530 can be designed so that a total path delay from when a clock pulse on the input clocking signal 305 is received at one of the system 500 input nodes until a corresponding shifted in data bit is available at the fourth functional component 540 (for subsequent output in the next clock cycle) has a shorter duration that one clock cycle of the input clocking signal 305.

As noted above, in some contexts, each of the digital data sources 350 has M parallel bit outputs. For example, each digital data source 350 is an M-bit counter. Some embodiments are configured for such contexts by implementing data path components as M parallel copies of the data path components. The first functional component 510 is implemented as M parallel copies of the first functional component 510, each for sequentially shifting in a respective sequence of bit data from a respective one of the M parallel bit outputs based on the buffered clocking signal to generate a respective one of M parallel data signals. The third functional component 530 includes M copies of the third functional component 530, each for controlling data delay to a respective one of the M parallel data signal to generate a respective one of M parallel buffered data signals. The fourth functional component 540 includes M parallel copies of the fourth functional component 540, each for outputting a respective one of the M buffered data signals responsive to the input clocking signal. In some such embodiments, a single copy of the second functional component 520 is used to control the clocking path for all M copies of the data path. In this way, M parallel data signals can be generated in a synchronized manner across all the M but outputs of the digital data sources 350. For example, a first serialized data output signal 345a represents serialized bits from the respective first bit output of all the digital data sources 350, a second serialized data output signal 345b represents serialized bits from the respective second bit output of all the digital data sources 350, and the symbol timing of the first and second serialized data output signals 345 are synchronized.

It will be understood that, when an element or component is referred to herein as "connected to" or "coupled to" another element or component, it can be connected or coupled to the other element or component, or intervening elements or components may also be present. In contrast, when an element or component is referred to as being "directly connected to," or "directly coupled to" another element or component, there are no intervening elements or components present between them. It will be understood that, although the terms "first," "second," "third," etc. may be used herein to describe various elements, components, these elements, components, regions, should not be limited by these terms. These terms are only used to distinguish one element, component, from another element, component. Thus, a first element, component, discussed below could be termed a second element, component, without departing from the teachings of the present invention. As used herein, the terms "logic low," "low state," "low level," "logic low level," "low," or "0" are used interchangeably. The terms "logic high," "high state," "high level," "logic high level," "high," or "1" are used interchangeably.

As used herein, the terms "a", "an" and "the" may include singular and plural references. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components. Furthermore, as used herein, the words "and/or" may refer to and encompass any possible combinations of one or more of the associated listed items.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments, as well as other embodiments, will be apparent to those of skill in the art upon reference to the description. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof. Those of skill in the art will appreciate variations of the above-described embodiments that fall within the scope of the invention. As a result, the invention is not limited to the specific embodiments and illustrations discussed above, but by the following claims and their equivalents.

What is claimed is:

1. A system for serialized read-out of bit data from a plurality of digital data sources, the system comprising:
    an output flop configured to output a serialized output data signal responsive to a buffered data signal and an input clocking signal;
    a data path comprising a plurality of gate groups, each having a respective subset of a plurality of transmission gates, each transmission gate to selectively output bit data from a respective one of a plurality of digital data sources in response to assertion of a respective gate enable signal, the data path providing the data signal from the respective gate outputs of the transmission gates to the output flop by adding an amount of data path delay to the data signal to generate the buffered data signal;
    a clock delay block configured to generate a buffered clocking signal by adding a amount of clock path delay to the input clocking signal; and
    a gate selector block coupled with the clock delay block to sequentially assert each respective gate enable signal in response to the buffered clocking signal, such that a selected one of the plurality of transmission gates is enabled in each clock cycle of the input clocking signal during a shift-out routine,
    wherein the amount of clock path delay is different for each of the plurality of gate groups, the amount of data path delay is different for each of the plurality of gate groups.

2. The system of claim 1, wherein:
    each transmission gate has a respective gate data input to receive the bit data from the respective one of the plurality of digital data sources, a respective gate enable input to receive the respective gate enable signal, and a respective gate output;
    each transmission gate is configured to provide the bit data at its respective gate data input as a data signal at its respective gate output when its respective gate enable signal is asserted; and
    each transmission gate is configured to provide high impedance at its respective gate output when its respective gate enable signal is de-asserted.

3. The system of claim 1, wherein the amount of clock path delay is inversely related to the amount of data path delay, so that a total path delay corresponding to the amount of clock path delay plus the amount of data path delay is substantially consistent across the plurality of gate groups.

4. The system of claim 1, wherein a total path delay corresponding to the amount of clock path delay plus the amount of data path delay is less than one clock period of the input clocking signal.

5. The system of claim 1, wherein:
    the clock delay block comprises a plurality of clock delay buffers; and
    the amount of clock path delay is generated for each of the plurality of gate groups using a different respective number of the clock delay buffers.

6. The system of claim 1, wherein the data path comprises:
- a data bus coupled with the respective gate outputs of the transmission gates to receive, in each clock cycle of the input clocking signal during the shift-out routine, the data signal from the selected one of the plurality of transmission gates enabled in the clock cycle; and
- a data delay block coupled between the data bus and the output flop to generate add at least a portion of the amount of data path delay to the data signal.

7. The system of claim 6, wherein:
- the data bus contributes a first portion of the amount of data path delay added to the data signal; and
- the data delay block contributes a second portion of the amount of data path delay added to the data signal.

8. The system of claim 7, wherein:
- one of the first or the second portion of the amount of data path delay is fixed across the plurality of gate groups; and
- the other of the first or the second portion of the amount of data path delay varies across the plurality of gate groups.

9. The system of claim 6, wherein:
- the plurality of gate groups comprises an integer number (N) gate groups;
- the data bus has N bus partitions, each coupled with the respective gate outputs of the transmission gates of a respective one of the N gate groups;
- the data delay block is coupled with the data bus at a first bus partition; and
- the bus partitions are coupled with each other via one-way bus buffers, such that communication of the data signal from any of the transmission gates of a first gate group propagate to the data delay block via the first bus partition without passing through any of the one-way bus buffers, and communication of the data signal from any other of the transmission gates propagates to the data delay block via at least two of the bus partitions and at least one of the one-way bus buffers.

10. The system of claim 1, wherein the gate selector block comprises:
- the transmission gates comprise an integer number (K) of transmission gates;
- an initiator flop triggered by the buffered clocking signal and configured to produce a HIGH logic level at an initiator output in a reset state and to produce a LOW logic level at the initiator output otherwise; and
- K gate activation flops, each triggered by the buffered clocking signal, wherein:
- each kth gate activation flop of the K gate activation flops has a respective kth output coupled with a respective kth one of the K transmission gates, such that a HIGH logic level at the respective kth output enables the kth one of the transmission gates;
- a first gate activation flop has a respective first input coupled with the initiator output; and
- each kth gate activation flop of the second through Kth gate activation flops has a respective kth input coupled with the (k−1)th output of the (k−1)th gate activation flop.

11. The system of claim 10, wherein:
- the plurality of gate groups comprises N gate groups, each gate group corresponding to a respective sequence of K/N of the transmission gates, such that the respective sequence of each nth gate group begins at an associated group-start gate that is the [(n−1)*(K/N)+1]th transmission gate of the K transmission gates;
- the data path includes a data bus having N bus partitions;
- each nth bus partition is coupled with the respective gate outputs of a corresponding nth disjoint subset of the K transmission gates;
- the bus partitions are coupled with each other via N−1 one-way bus buffers, each bus buffer configured to provide high input impedance and high output impedance when disabled, and to provide high input impedance and low output impedance when enabled; and
- each nth one-way bus buffer corresponds to a respective (n+1)th gate group and is configured to be enabled responsive to assertion of the respective gate enable signal for the group-start gate associated with the (n+1)th gate group.

12. The system of claim 1, wherein each transmission gate is coupled with the respective gate data input via a respective input buffer.

13. The system of claim 1, wherein the data path comprises at least one hundred transmission gates grouped into at least four gate groups.

14. The system of claim 1, wherein:
- each one of the plurality of digital data sources has M parallel bit outputs;
- the data path comprises M parallel data paths, wherein each transmission gate is a parallel set of M transmission gates, each to selectively output bit data from a respective one of the M parallel bit outputs in response to assertion of the respective gate enable signal.

15. An analog-to-digital converter system comprising:
- a plurality of digital counters, each having a respective counter output to output a respective one of a plurality of digital count values corresponding to a detected analog input voltage level; and
- a serial read-out system comprising:
  - an output flop configured to output a serialized output data signal responsive to a buffered data signal and an input clocking signal, the serialized output data signal configured to have the plurality of digital count values represented thereon;
  - a data path comprising a plurality of gate groups, each having a respective subset of a plurality of transmission gates, each transmission gate coupled with one of the respective counter outputs to selectively output bit data from a respective one of the plurality of counters in response to assertion of a respective gate enable signal, the data path providing the data signal from the respective gate outputs of the transmission gates to the output flop by adding an amount of data path delay to the data signal to generate the buffered data signal;
  - a clock delay block configured to generate a buffered clocking signal by adding an amount of clock path delay to the input clocking signal; and
  - a gate selector block coupled with the clock delay block to sequentially assert each respective gate enable signal in response to the buffered clocking signal, such that a selected one of the plurality of transmission gates is enabled in each clock cycle of the input clocking signal during a shift-out routine,
  - wherein the amount of clock path delay is different for each of the plurality of gate groups, the amount of data path delay is different for each of the plurality of gate groups.

16. A system for serialized read-out of bit data from a plurality of digital data sources, the system comprising:

means for sequentially shifting in a sequence of bit data based on a buffered clocking signal to generate a data signal, the sequence of bit data pre-grouped into gate groups;

means for controlling clock delay to an input clocking signal to generate the buffered clocking signal, an amount of the clock delay controlled to be different for each of the gate groups;

means for controlling data delay to the data signal to generate a buffered data signal, an amount of the data delay controlled to be different for each of the gate groups; and means for outputting the buffered data signal responsive to the input clocking signal.

17. The system of claim 16, wherein:

each one of the plurality of digital data sources has M parallel bit outputs;

the means for sequentially shifting in comprise M parallel means, each for sequentially shifting in a respective sequence of bit data from a respective one of the M parallel bit outputs based on the buffered clocking signal to generate a respective one of M parallel data signals;

the means for controlling data delay comprise M parallel means, each for controlling data delay to a respective one of the M parallel data signal to generate a respective one of M parallel buffered data signals;

the means for outputting comprise M parallel means, each for outputting a respective one of the M buffered data signals responsive to the input clocking signal; and the means for controlling clock delay is a single means for controlling clock delay.

18. The system of claim 16, wherein:

a total amount of path delay for any of the gate groups corresponds to the amount of the clock delay and the amount of the data delay; and the total amount of path delay is balanced across all of the gate groups, such that the added amount of the data delay is controlled to be smaller for those of the gate groups for which the added amount of the clock delay is controlled to be larger, and the added amount of the data delay is controlled to be larger for those of the gate groups for which the added amount of the clock delay is controlled to be smaller.

19. The system of claim 16, wherein the means for sequentially shifting in comprise means for sequentially enabling each of a plurality of transmission gates, each transmission gate coupled with one of the plurality of digital data sources to receive a corresponding portion of the bit data.

20. The system of claim 16, wherein:

each gate group corresponds to a respective portion of the bit data;

the means for controlling data delay comprise a partitioned data bus having a plurality of bus partitions; and the means for sequentially shifting in comprise means for sequentially shifting in each respective portion of the bit data to a respective bus partition of the partitioned data bus, such that the means for controlling data delay adds a different amount of the data delay for each gate group based on the respective bus partition used for sequentially shifting in the respective portion of the bit data corresponding to the gate group.

* * * * *